United States Patent
Wakana et al.

(10) Patent No.: US 9,276,123 B2
(45) Date of Patent: Mar. 1, 2016

(54) OXIDE SEMICONDUCTOR TARGET AND OXIDE SEMICONDUCTOR MATERIAL, AS WELL AS SEMICONDUCTOR DEVICE USING THE SAME

(71) Applicant: Hitachi Metals, Ltd., Minato-ku, Tokyo (JP)

(72) Inventors: Hironori Wakana, Tokyo (JP); Hiroyuki Uchiyama, Tokyo (JP); Hideko Fukushima, Tokyo (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 13/958,578

(22) Filed: Aug. 4, 2013

(65) Prior Publication Data
US 2014/0042431 A1 Feb. 13, 2014

(30) Foreign Application Priority Data
Aug. 7, 2012 (JP) .................................. 2012-174692

(51) Int. Cl.
*H01L 29/10* (2006.01)
*H01L 21/28* (2006.01)
*H01L 29/786* (2006.01)
(Continued)

(52) U.S. Cl.
CPC .......... *H01L 29/7869* (2013.01); *C23C 14/086* (2013.01); *C23C 14/3414* (2013.01); *H01L 21/02554* (2013.01); *H01L 21/02565* (2013.01); *H01L 21/02631* (2013.01); *H01L 27/3244* (2013.01)

(58) Field of Classification Search
CPC .................................................. H01L 29/7869
USPC .............. 438/93, 104, 603, 785; 257/43, 613, 257/E21.118, 542
See application file for complete search history.

(56) References Cited

U.S. PATENT DOCUMENTS

2011/0001136 A1* 1/2011 Hasegawa et al. ............... 257/43
2011/0233536 A1 9/2011 Kim et al.
(Continued)

FOREIGN PATENT DOCUMENTS

JP 2011-205054 A 10/2011
JP 2012-033854 A 2/2012
(Continued)

OTHER PUBLICATIONS

Office Action for related Chinese Application No. 20130350174.6 (mailed Sep. 14, 2015).
(Continued)

*Primary Examiner* — Calvin Lee
(74) *Attorney, Agent, or Firm* — Miles & Stockbridge P.C.

(57) ABSTRACT

There are provided an oxide semiconductor material, capable of attaining stability of a threshold voltage (Vth) (threshold voltage shift amount ΔVth within a range of ±3 V in PDS and NBIS) and field-effect mobility of 5 $cm^2$/Vs or more necessary for the operation of an OLED display device. An oxide semiconductor target in which an oxide semiconductor material with one or more of oxides of W, Ta, and Hf of 5d transition metal added each by 0.07 to 3.8 at %, 0.5 to 4.7 at %, and 0.32 to 6.4 at % to a semiconductor material with Zn—Sn—O as a main ingredient is sintered; a semiconductor channel layer formed by using the target, and an oxide semiconductor material for TFT protective film, as well as a semiconductor device having the same.

8 Claims, 15 Drawing Sheets

(51) Int. Cl.
*C23C 14/08* (2006.01)
*H01L 21/02* (2006.01)
*C23C 14/34* (2006.01)
*H01L 27/32* (2006.01)

(56) References Cited

U.S. PATENT DOCUMENTS

2013/0032798 A1* 2/2013 Miki et al. .................. 257/43
2013/0248858 A1 9/2013 Morita et al.

FOREIGN PATENT DOCUMENTS

| | | |
|---|---|---|
| JP | 2012-66968 A | 4/2012 |
| WO | 2012/074046 A1 | 6/2012 |

OTHER PUBLICATIONS

Office Action for related Japanese Application No. 2012-174692 (mailed Dec. 1, 2015).

* cited by examiner

OXIDE SEMICONDUCTOR TARGET AND OXIDE SEMICONDUCTOR MATERIAL, AS WELL AS SEMICONDUCTOR DEVICE USING THE SAME

CLAIM OF PRIORITY

The present application claims priority from Japanese patent application JP 2012-174692 filed on Aug. 7, 2012, the content of which is hereby incorporated by reference into this application.

BACKGROUND OF THE INVENTION

1. Field of the Invention

The present invention concerns an oxide semiconductor target, an oxide semiconductor material; and a thin film transistor (TFT) having a semiconductor channel layer formed by using the oxide semiconductor target.

2. Description of the Related Art

Since thin film transistors (TFT) have a small device area and thus are space-saving, they are used as transistors for driving display devices in various portable electronic equipment such as mobile telephones, notebook personal computers, and PDAs.

Heretofore, most of thin film transistors have been manufactured from silicon semiconductor materials typically represented by amorphous silicon or polycrystal silicon. This is because the thin film transistors can be manufactured by using conventional manufacturing steps and manufacturing techniques of semiconductor devices.

However, when the thin film transistors are manufactured by using the conventional steps of manufacturing semiconductor devices, since the processing temperature is 350° C. or higher, substrate materials usable therefor are restricted. Particularly, since heat resistant temperature of most of glass substrates or flexible resin substrates is 350° C. or lower, it is difficult to form the thin film transistors on the substrates described above by using the conventional steps of manufacturing the semiconductor devices.

Accordingly, research and development have been conducted for thin film transistors using oxide semiconductor materials that can be deposited at a low temperature for a channel layer. By using the oxide semiconductor film to the channel layer, thin film transistors can be formed over the glass substrates or flexible resin substrates. Further, since oxide semiconductors have a field-effect mobility higher by one digit or more than that of the conventional amorphous Si, a novel device not present so far can be manufactured at a low cost. Accordingly, many applications of using the oxide semiconductor materials have been reported for RFID (Radio Frequency Identification) tags as well as display devices.

Among them, for obtaining an OLED (Organic Light-Emitting Diode) expected as a display device in the next generation, it is necessary and indispensable to ensure the field-effect mobility of 5 cm$^2$/Vs or more and the reliability to light (stress resistance) since the OLED is a self-emitting device. Further, with a view point of power consumption, it is important to obtain a TFT having a small subthreshold slope (subthreshold swing).

As the material for the oxide semiconductor, In—Ga—Zn—O (IGZO), etc. have been reported. However, since the materials contain rare metals such as In and Ga in a great amount, there may be a concern of increasing the material cost. On the contrary, since Zn—Sn—O (ZTO) materials contain no rare metals, they are superior in view of resource and cost. For improving the reliability of ZTO, Japanese Patent Laid-open No. 2012-033854 reports suppression of plasma damage during formation of a protective film and decrease of a threshold voltage shift amount ($\Delta$Vth=−4 to −6.5 V) in a light stress test, by adding at least one of Al, Hf, Ta, Ti, Mb, Mg, and Ga to ZTO by 0.01 to 0.3 at %. However, the threshold voltage shift amount after formation of the protective film is 4 V in terms of an absolute value and improvement is necessary for the reliability and the controllability of the threshold voltage (Vth). Further, Japanese Patent Laid-Open No. 2011-205054 reports characteristics of a semiconductor synthesized at a ratio of starting materials of Zn:Sn:Hf=0.003 mol:0.003 mol:0.0012 mol with an aim of improving the electric characteristics of a coated type semiconductor material. While improvement of the semiconductor characteristics has been conformed by addition of about 17% by mol of Hf to ZTO in the coated type semiconductor material, there are still present many problems in the reliability (stress resistance).

In view of the above, for applying ZTO oxide semiconductor materials to the OLED described device, etc., it is necessary to satisfy the field-effect mobility of 5 cm$^2$/Vs that is necessary for driving the OLED and a low threshold voltage that can control the threshold voltage. For this purpose, the improvement of the field-effect mobility and the improvement of the stress resistance against light or electricity are called for.

SUMMARY OF THE INVENTION

In the explanation described above, the semiconductor device as a target Is a field effect thin film transistor (TFT) and, particularly, a TFT using ZTO for the material (hereinafter referred to as ZTO-TFT). Accordingly, when it is referred to hereinafter as a thin film transistor, this means the ZTO-TFT unless otherwise specified particularly.

When it is intended to apply the ZTO-TFT to the OLED display device, it is necessary to ensure a high Ion/Ioff ratio (ratio between a maximum drain current and a drain current upon cut off), a high field-effect mobility, a small threshold voltage shift amount in terms of an absolute value and, in addition, stability of the threshold voltage (Vth). Specifically, it is more preferred that the Ion/Ioff ratio is 10$^7$ or more, the field-effect mobility is 5 cm$^2$/Vs or more, the subthreshold slope is 0.3 V or less, and the threshold voltage shift amount $\Delta$Vth after application of light or electric stress is within ±3V (theoretically: 0 V). It is particularly important to realize a ZTO-TFT having the field-effect mobility of 5 cm$^2$/Vs or more, the $\Delta$Vth after application of light or electric stress of 3 V or less in terms of an absolute value, and an initial threshold voltage of about 0V.

In a ZTO-TFT in which at least one of Al, Hf, Ta, Ti, Nb, Mg, and Ga is added by 0.01 to 0.3 at % to ZTO in Japanese Patent Laid-Open No. 2012-033854, while the threshold voltage shift amount after application of the light stress is decreased, $\Delta$Vth is as large as 4 V in terms of the absolute value, which is still insufficient. Then, when the ZTO-TFT is intended to apply to the OLED display device, it is preferred to suppress the $\Delta$Vth within ±3 V for PBS (positive bias stress) and NBIS (negative bias illumination stress). Further, the Japanese Patent Laid-Open No. 2012-033854 discloses Al and Ga as the additive material to ZTO, and such materials have been well-known as dopant materials to ZnO. Since the threshold voltage (Vth) is shifted to the negative side due to increase in the number of carriers by the addition or Al or Ga, it is anticipated that control of the threshold voltage is difficult when application to the OLED display device is considered.

FIG. 1 illustrates current-voltage characteristics (Id-Vg) of a ZTO-TFT with addition of vanadium oxide of a 3d transition metal and molybdenum oxide of a 4d transition metal provided by the present inventors with an aim of improving the TFT characteristics and the reliability. Since a material having a stronger electron correlation may possibly induce carriers when added to ZTO, ZTO with addition of Mo and V oxides is rendered electroconductive and it is difficult to turn-off the TFT at the gate voltage of 10V to 20 V. Accordingly, it is necessary to consider, for example, optimization of the addition amount of use of a material having a weak electron correlation.

Further, when a protective film for the ZTO-TFT is formed, carriers on the surface of the ZTO film are increased upon formation of the ZTO-TFT protective film to render the ZTO film electroconductive due to oxygen depletion at the surface of the ZTO semiconductor layer by collision of ionized element in the course of forming the protective film. Then, there is a subject that the ZTO-TFT characteristics are deteriorated remarkably by the addition.

For attaining the high field-effect mobility of 5 $cm^2/Vs$ or more and improving the resistance against light stress in the ZTO-TFT, it is important to decrease the trap level which is attributable to the oxygen depletion, at the boundary between the oxide semiconductor and the gate insulation layer. For decreasing the trap level, it is important to decrease oxygen defects by compensation of oxygen. Therefore, the present inventors considered, that addition of elements, for example, a transition metal oxide as a material having a strong electron correlation is effective in order to compensate for the oxygen defects in ZTO. Specifically, such elements include 3d transition metals including Sc, Ti, V, Cr, Mn, Fe, Co, Ni, and Cu, 4d transition metals including Y, Zr, Nb, Mo, Tc, Ru, Rh, Pd, and Ag, and 5d transition metals including La, Ce, Pr, Nd, Pm, Sm, Su, Gd, Tb, Dy, Ho, Sr, Tm, Yb, Lu, Hf, Ta, K, Re, Os, Ir, Pt, and Au. For the 3d, 4d, and 5d transition metal oxides, it is known that the electron correlation is weakened in the order of 3d, 4d, and 5d transition metal oxides and it is expected that strong electron correlation causes formation of carriers. However, the present inventors supposed that the 5d transition metal oxides having an appropriate correlation are effective considering that they can decrease the trap level by oxygen compensation without remarkably deteriorating the characteristics of the ZTO-TFT.

It is confirmed that when the 3d and 4d transition metals of strong electron correlation are added to ZTO, the threshold voltage shift amount to the negative side due to carrier formation is large and control of the threshold voltage is difficult, whereas addition of the 5d transition metals gives less effect on the ZTO-TFT, showing excellent TFT characteristics. FIG. 2 illustrates current-voltage characteristics (Id-Vg) of a thin film transistor upon addition of an oxide of the 5d transition metal, for example, tungsten included in the 5d transition metal. As shown in the graph, Vth is shifted, to the vicinity of 0 V by the addition of a tungsten oxide to ZTO. It is considered that oxygen depletion in the film is decreased to suppress the formation of the carriers in the film. In view of the above, it has been found that the 5d transition metal oxide is effective as the additive to ZTO.

That is, the present invention provides an oxide semiconductor target formed by sintering a Zn—Sn—O oxide semiconductor material including zinc oxide and tin oxide as a main ingredient, wherein a compositional ratio of Zn, that constitutes the Zn—Sn—O oxide semiconductor, that is, [Zn]/([Zn]+[Sn]) is within a range from 0.5 to 0.85 by at %, a 5d transition metal is added to the oxide semiconductor material, the 5d transition metal is W (tungsten), and the addition amount of the W is within a compositional range of 0.07 to 3.8 by at %.

A more preferred addition amount of the W is within the compositional range of 0.07 to 2.0 by at %.

In the oxide semiconductor target of the invention, Ta (tantalum) may also be used instead of the W as the 5d transition metal, and the addition amount of the Ta is within a compositional range of 0.5 to 4.7 by at %. A more preferred addition amount of Ta is within a compositional range of 0.5 to 2.2 by at %.

In the oxide semiconductor target of the invention, Hf (hafnium) may also be used instead of the W as the 5d transition metal, and the addition amount of the Hf is within a compositional range of 0.32 to 6.4 by at %. A more preferred addition amount of the Hf is within a compositional range of 0.32 to 2.1 by at %.

The present invention also provides an oxide semiconductor target in which metal elements of Ta (tantalum) and Hf (hafnium) are used, in addition to the W as the 5d transition metal, and when:

an upper limit of addition amounts is defined as a value, obtained by assuming the maximum addition amount of each of the metal elements added alone to the oxide semiconductor material as 1, normalizing each of the metal elements to be added by the maximum addition amount, and controlling within such a range that the total of the normalized addition amounts of each of the metal elements does not exceed 1; and a lower limit of addition amounts is defined as a value obtained by assuming the minimum addition amount of each of the metal elements added, alone to the oxide semiconductor material as 1, normalizing each of the metal elements to be added by the minimum addition amount, and controlling within such a range that the total of the normalized, addition amounts of each of the metal elements is 1 or more, the addition amounts of the W, Ta, and Hf in total is within a compositional range between the upper limit and the lower limit.

In this case, the maximum addition amount of the metal element is more preferably 3.8 at % of W, 4.7 at % of Ta, and 6.4 at % of Hf, and the minimum addition amount of the metal element is 0.07 at % of W, 0.5 at % of Ta, and 0.32 at % of Hf.

Further, in the oxide semiconductor target of the invention, the relative density of the sintered oxide semiconductor material is preferably 95% or more.

A novel oxide semiconductor material suitable as a protective film with an aim of improving the reliability, for example, of the resistance against light stress can be obtained by using the oxide semiconductor target of the invention. That is, the oxide semiconductor material of the invention is an oxide semiconductor material having an insulation property which is used as the protective film of the semiconductor device in which the 5d transition metal is added to a Zn—Sn—O oxide semiconductor material including zinc oxide and tin oxide as a main ingredient, the 5d transition metal is W (tungsten), and the W is contained by 8 at % or more.

The oxide semiconductor material of the invention may use Ta (tantalum) instead of the W as the 5d transition metal and contain the Ta by 9 at % or more.

Further, the oxide semiconductor material may use Hf (hafnium) instead of the W as the 5d transition metal and contain the Hf by 11 at % or more.

Further, the invention may also provide a field effect transistor including a semiconductor layer formed over a semiconductor substrate by using the oxide semiconductor target of the invention, a source electrode and a drain electrode provided to the semiconductor layer and disposed being spaced from each other, a gate electrode provided to a region of the semiconductor layer situated between the source electrode and the drain electrode at a position capable of providing a bias potential.

The present invention may also provide a field effect transistor having the semiconductor layer, and a protective insulation film coated so as to cover a region containing the semiconductor layer, the source electrode, and the drain electrode in which the protecting insulation film includes any one of the oxide semiconductor materials.

The present invention may also provide a sputtering target for the semiconductor film material and the protective film material.

The present invention can provide a ZTO thin film transistor having high electric-field mobility of 5 $cm^2/Vs$ or more and a stable threshold voltage shift amount within a range: $\Delta Vth=\pm 3$ V.

Further, when the material according to the invention is used, a channel etching structure can be obtained and a protective film having less oxygen defects in the film can be formed with less damage, and a display device of high reliability can be provided at a low cost.

DETAILED DESCRIPTION OF THE PREFERRED EMBODIMENTS

Figure 1:
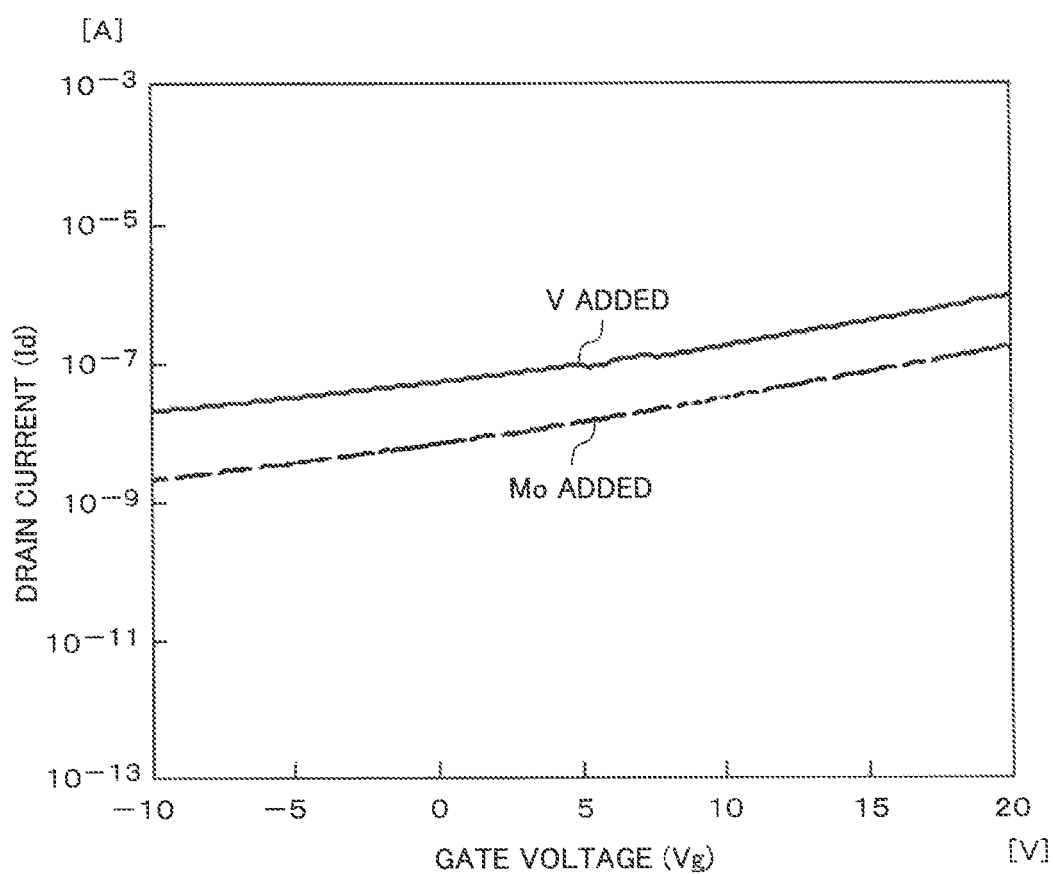
FIG. 1 is a graph illustrating a relation between a gate voltage (Vg) and a drain current (Id) of a ZTO-TFT with addition of oxides of a 3d transition metal and a 4d transition metal.

In the following embodiments, a description is to be made while dividing into a plurality of sections or embodiments when this is necessary for the sake of convenience. However, they are not unrelated to each other but are in such a relation that one is modification, applications, details, supplementary explanation, etc. of a part or entirety of another unless otherwise specified. Further, in the following embodiments, when numbers of constituents, etc. (including numbers, numerical values, quantity, range, etc.) are referred to, they are not restricted to the specified number but may be more than or less than the specified number unless otherwise specified or they are apparently restricted to the specified numbers in principle.

Further, in the following embodiments, it is needless to say that the constituent elements (also including constituent steps, etc.) are not always essential unless otherwise specified or apparently considered as essential in principle. In the same manner, when the shape, positional relation, etc. of the constituents, etc. are referred to in the following embodiments, they include those which are substantially approximate to or similar with the shape, etc. thereof unless otherwise specified and considered apparently not so in principle. This is applicable also to the numerical values, etc. (including numbers, numerical values, quantity, range, etc.).

Preferred embodiments of the invention are to be described specifically with reference to the drawings. Throughout the drawings for explaining the embodiments, those having identical functions carry the same references as a rule, for which duplicate descriptions are to be omitted. Also, unless particularly required, explanations of identical or similar parts are not to be repeated in principal in the embodiments. Further, in the drawings used for the following embodiments, even plan views may be sometimes hatched in order to make the drawings easy to see.

First Embodiment

At first, an oxide semiconductor sputtering target in a first embodiment of the invention is to be described.

Figure 3:
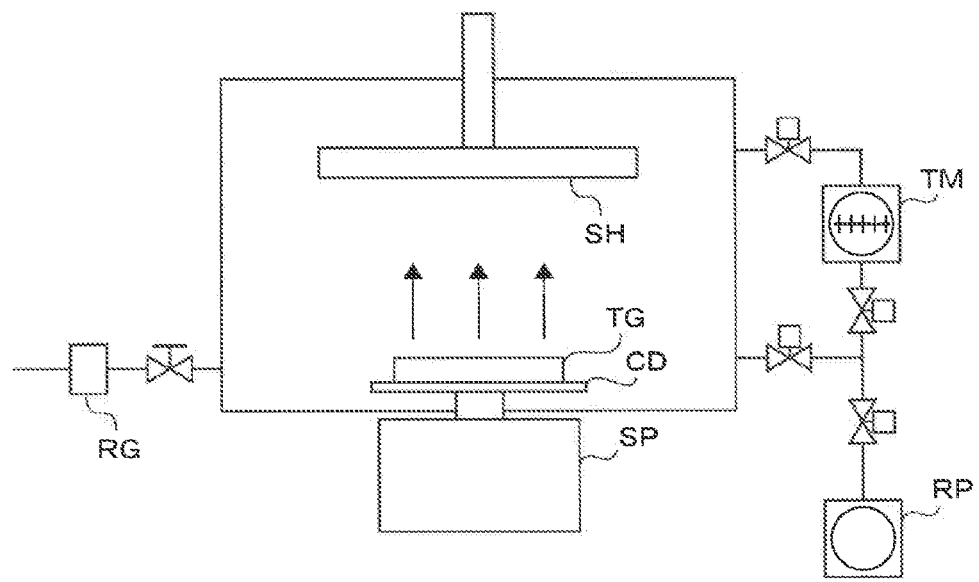
FIG. 3 is a schematic view for explaining the outline of a magnetron sputtering apparatus using an oxide target of the first embodiment of the invention.

FIG. 3 is a schematic view of a magnetron sputtering apparatus applied to a sputtering target of the invention. An example of a method of depositing an oxide semiconductor is to be shown below.

A sample on which a thin film is intended to be deposited is placed over the surface of a sampling holder SH being opposed to an oxide semiconductor target Tg.

A reaction gas RG is introduced by on-off of a control valve into a chamber which is roughly evacuated by a rotary pump RP and, successively, maintained at a desired, degree of vacuum by a turbo-molecular pump TM. An oxide semiconductor in the oxide semiconductor target is driven out by the introduced reaction gas by operating a sputtering power source and applying a bias to a sputtering cathode CD, and an oxide semiconductor substrate is deposited over the surface of the sample.

Then, a sputtering target used in this embodiment which is used in the magnetron sputtering apparatus described above is to be described specifically.

A method of manufacturing the oxide sintered target of the invention is generally as below. At first, respective powders at high purity of zinc oxide (purity>99.9%) and tin oxide (purity>99.9%) are weighed to such molar amount that a [Zn]/([Zn]+[Sn]) compositional ratio is 0.6 and, after adding a tungsten oxide powder (purity>99.9%) such that W is 0 to 7.8 at %, an aqueous solvent is added and mixed for several hours or more to form a slurry. Polyvinyl alcohol or the like as a binder is added to the slurry, after drying, they are granulated, the granulates are shaped in a mold and then sintered for several hours in atmospheric air at about 600° C. for removing the binder in solid matters. The solid matters are further sintered in a nitrogen gas stream or under a reduced pressure at a temperature of about 1300° C. to form a starting material for the target material. A conductive target introduced with oxygen defects is formed by sintering in an oxygen-free state. The obtained sintered body is shaped into desired shape and size by grinding to obtain a completed product of the sintered target.

W contained in the completed sintered target is within a range of 0 to 7.8 at %.

The relative density of the sintered oxide semiconductor material is 95 % or more. When it is used as a sputtering target, bonding treatment is applied to a metal back plate on the side of the cathode electrode, so that it can be used as the sputtering target.

Figure 4:
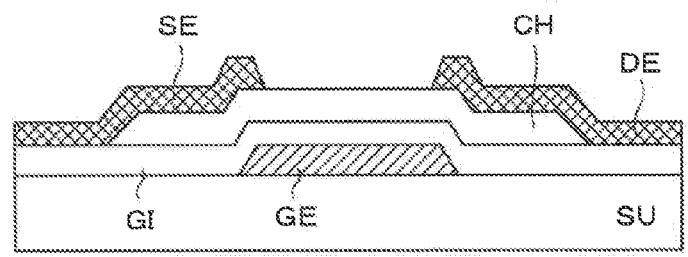
FIG. 4 is a cross sectional view of a thin film transistor of the first embodiment of the invention.

FIG. 4 is a cross sectional view illustrating a structure of a thin film transistor using an oxide semiconductor channel layer formed by utilizing the sputtering target of the invention. The thin film of the transistor used herein has been manufactured by using a ZTO sputtering target TG using the magnetron sputtering apparatus illustrated in FIG. 3.

The manufactured thin film is applied to a bottom gate/top contact type thin film transistor illustrated in FIG. 4. The bottom gate means a structure in which a gate electrode is disposed in a layer below the channel layer (oxide semiconductor layer) and the top contact means a structure in which a source electrode and a drain electrode are disposed in a layer above the channel layer.

The bottom gate/top contact type thin film transistor of this embodiment is manufactured by the following method.

FIG. 5 illustrates a process flow of the thin film transistor.

First, an insulating substrate SU is provided. The material for the substrate SU may include, for example, Si (silicon), sapphire, quartz, glass, flexible plastic film, etc. The material for the plastic film may include, for example, polyethylene terephthalate, polyethylene naphthalate, polyether imide, polyacrylate, polyimide, polycarbonate, cellulose triacetate, and cellulose acetate propionate. Optionally, those having an insulating coating layer formed on the surface of the material described above may also be used.

Figure 5A:
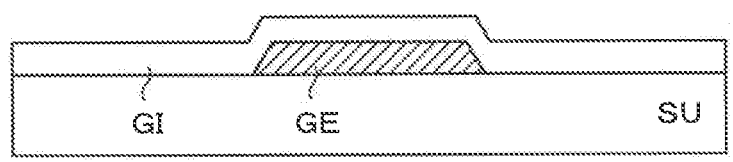
FIG. 5A is a cross sectional view illustrating a method of manufacturing the thin film transistor illustrated in the first embodiment of the invention.

Then, as illustrated in FIG. 5A, a conductive film is deposited over the upper surface of the substrate SU and, successively, the conductive film is patterned to form a gate electrode GE. The conductive film forming the gate electrode GE may include, for example, a monolayer film of a metal such as Mo (molybdenum), Cr (chromium), W (tungsten), Al (aluminum), Cu (copper), Ti (Titanium), Ni (nickel), Ta (tantalum), Ag (silver), Co (cobalt), Zn, Au (gold), Pt (platinum), etc. an alloy film containing two or more of such metals, and a stacked film of such metals. Further, a conductive metal oxide film including ITO (In—Sn—O: indium-tin-oxide), ZnO (zinc oxide) with addition of Al, Ga, In or B (boron), etc. and a stacked film of such conductive metal oxide and metal described above may also be used. Further, a monolayer film of a conductive metal nitride such as TiN (titanium nitride), a stacked film of the conductive metal nitride and the metal described above may also be used.

Various conductive films described above are deposited, for example, by a CVD method, a sputtering method, and a vapor deposition method, and patterning is performed by dry etching or wet etching using a photoresist film as a mask.

Successively, a gate insulation film GI is formed over the upper surface of the substrate SU formed with the gate electrode GE.

The insulation film forming the gate insulation film GI may include, for example, a silicon oxide film, a silicon nitride film, an aluminum oxide film, an aluminum nitride film, a $Y_2O_3$ (yttrium oxide) film, a $HfO_2$ (hafnium oxide) film, a YSZ (yttria stabilized zirconia) film, and an organic polymeric insulation film. The material for the organic polymeric insulation film may include, for example, polyimide derivatives, benzocyclobutene derivatives, photoacrylic derivatives, polystyrene derivatives, polyvinyl phenol derivatives, polyester derivatives, polycarbonate derivatives, polyester derivatives, polyvinyl acetate derivatives, polyurethane derivatives, polysulfone derivatives, acrylate resins, acrylic resins, epoxy resins, and PARYLENE (registered trademark). The insulation film is deposited, for example, by a CVD method, a sputtering method, a vapor deposition method, and a coating method.

Figure 5B:
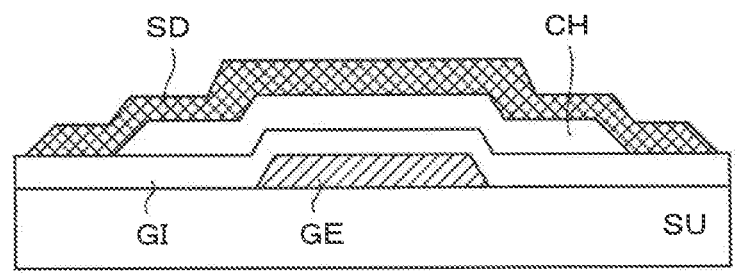
FIG. 5B is a cross sectional view illustrating a method of manufacturing the thin film transistor illustrated in the first embodiment of the invention.

Then, as illustrated in FIG. 5B, an amorphous oxide semiconductor CH is formed over the gate insulation film GI. The amorphous oxide semiconductor layer CH is manufactured by the sputtering apparatus illustrated in FIG. 3. The oxide film constituting the amorphous oxide semiconductor layer can be deposited, in addition to the sputtering method, by a CVD method, a pulsed laser deposition (PLD) method, a coating method, a printing method, and a covapor deposition method. The film thickness is preferably about 5 nm to 100 nm. Further, after forming the amorphous oxide semiconductor layer CH, impurities may be doped or annealing treatment may be applied optionally. In this embodiment, atmospheric annealing is applied at 300° C. for one hour. Further, the oxide film described above can be patterned by dry etching or wet etching using a photoresist film as a mask. In this embodiment, the oxide film is fabricated by wet etching using ITO-07N etching solution.

Then, when a contact hole (not illustrated) is formed for connection of a source/drain electrode layer SD to be formed, later and the gate electrode layer GE, a contact hole of a desired shape (not illustrated) is formed by wet etching or dry etching of the gate insulation layer GI using a photoresist film as an etching mask.

Successively, a conductive film SD for the source/drain electrode is deposited over the amorphous oxide semiconductor layer CH. The conductive film SD may include, for example, various conductive films that form the gate electrode GE described above. Further, the conductive film SD is deposited, for example, by an electron beam vapor deposition method or a sputtering method. In this embodiment, a Mo electrode of 150 nm in thickness is deposited as a source/drain electrode SE by the sputtering method (refer to FIG. 4).

Figure 5C:
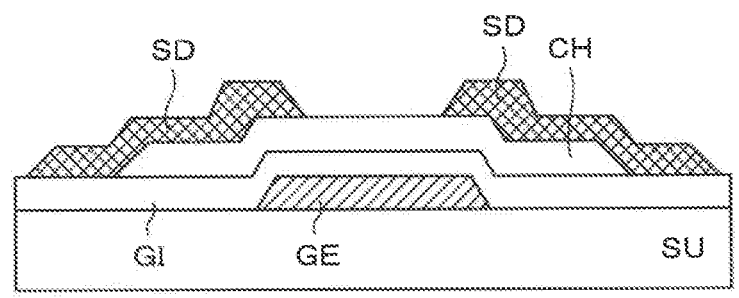
FIG. 5C is a cross sectional view illustrating a method of manufacturing the thin film transistor illustrated in the first embodiment of the invention.

Then, as illustrated in FIG. 5C, the source/drain electrode SD are fabricated by a commercial Al etching solution (mixed acid) using a photoresist film as a mask. The etching rate of a channel material including Zn—Sn—O with addition of W by the Al etching solution is about 0.05 nm/min. and a higher resistance than that of the channel material is shown. On the other hand, the etching rate of the Mo electrode by the Al etching solution is 120 nm/min. That is, it has been found that even when over etching is applied at such an extent that is usually applied upon etching the Mo electrode, the channel material is scarcely etched. In view of the above, the source/drain electrodes SD can be formed with scarce distribution in the film thickness after fabrication of the Mo electrode.

On the other hand, when the Al etching solution described above is applied to the In—Ga—Zn—O (IGZO) system which is the conventional oxide semiconductor material, the etching rate is 30 nm/min. On the other hand, when the Mo electrode of 150 nm thickness is intended to be fabricated, since the etching rate of the Al etching solution is 120 nm/min., it requires a time of about 1.5 min. including the over etching time. In the etching of the Mo electrode, appropriate over etching is usually performed in addition to just etching. In this case, the IGZO channel is exposed to the etching solution by the over etching time for the Mo electrode. For example, when over etching is applied for several tens of seconds, the surface of IGZO is etched, by about 10 to 20 nm. Accordingly, when the IGZO film thickness is 25 nm, most of the film is etched off. In view of the above, it can be seen that the channel etching structure of IGZO-TFT is difficult to be obtained by wet etching.

In view of the above, decrement of the film thickness of ZTO, for example, 25 nm by wet etching is about 0.02 nm by using ZTO with addition of W for the oxide semiconductor material, and it can be confirmed that a good channel etching structure is obtained.

By the process flow for the thin film transistor described above, a thin film field effect transistor (hereinafter referred to simply as TFT) including a gate electrode layer GE, a source/drain electrode layer SD, an oxide semiconductor layer CH, and a gate insulation layer GI is formed. Then, the oxide semiconductor layer CH situated between the source/drain electrode SD for the source and the source/drain electrode layer SD for the drain and above the gate electrode layer GE functions as a channel region of the TFT, and the gate insulation film GI at a portion situated between the channel region (oxide semiconductor layer CH) and the gate electrode layer GE functions as the gate insulation film of the TFT.

Then, a protective film (protective layer, protective film layer) PA may be formed, optionally, as an insulation layer over the substrate SU so as to cover the source/drain electrode layer SD, an antenna/interconnect layer AW (not shown) and the oxide semiconductor layer CH. For the protective film PA, a silicon oxide film ($SiO_x$) of about 300 nm thickness formed, for example, by a CVD method, can be used. In addition to the silicon oxide film, other oxide films such as an aluminum oxide ($AlO_x$) film may also be used. Further, inorganic insulation films such as a silicon nitride ($SiN_x$) film or an aluminum nitride (AlN) film, and organic insulation films, for example, of polyimide derivatives, benzocyclobutene derivatives, photoacryl derivatives, polystyrene derivatives, polyvinyl phenol derivatives, polyester derivatives, polycarbonate derivatives, polyester derivatives, polyvinyl acetate derivatives, polyurethane derivatives, polysulfone derivatives, acrylate derivatives, acrylic resins, and epoxy resins may also be used in addition to the oxide film, but the use of the oxide film is more preferred. Further, as a deposition method of the protective film PA, a sputtering method, a vapor deposition, a coating method, or the like may also be used in addition to the CVD method described above.

Subsequently, heat treatment at 200° C. to 450° C. can be applied with an aim of improving the characteristics of the TFT. When a flexible substrate is used as the substrate SU, the heat treatment temperature is preferably 350° C. or lower. Since the heat treatment is applied, with an aim of improving the characteristics of the TFT, the heat treatment may be applied at any time so long as the treatment is applied after forming the channel layer (corresponding to the oxide semiconductor layer CH described above), and an identical effect can be obtained.

Then, the result of measurement on the thin film transistor manufactured by using the sputtering target described above is to be explained. Main measuring items (1) to (3) and stress application conditions are shown below.

(1) Characteristics of a thin film transistor (drain current-gate voltage) (Id-Vg) characteristics), (2) threshold voltage, and (3) subthreshold slope are examined.

(a) Threshold Voltage (Vth):

Generally, a threshold voltage is a value of a gate voltage when a transistor transits from an off-state (low drain current state) to an on state (high drain current state). In this embodiment, while a method of measuring characteristics Id-Vg of the thin film transistor and defining a Vg value at a predetermined Id value as a threshold voltage (Vth) is used, a method of determining the threshold voltage based on extrapolation points of the Id-Vg curve may also be used.

(b) Calculation of Field-effect Mobility:

The field-effect mobility is calculated according to the formula that represents the characteristics of a thin film transistor by using shape data, for example, a gate length, a gate width, etc. and electric data of measured drain current (Id) and gate voltage (Vg) and an obtained threshold voltage (Vth) of the manufactured thin film transistor.

(c) Stress Application Conditions and Threshold Voltage Shift Amount ($\Delta Vth$):

A predetermined stress is applied to a thin film transistor and a difference of threshold voltage before and after the stress application is determined.

The applied stress includes two types. One is PBS (positive bias stress) and the other is NBIS (negative bias illumination stress). For the PBS, a predetermined positive voltage is applied as Vg to the thin film transistor, and a threshold voltage Vth is measured at Vd=0 V after lapse of a predetermined time. Then, a difference relative to the previously measured initial threshold voltage is determined, and defined as a threshold voltage shift amount $\Delta Vth$.

For PBS in this embodiment, PBS is defined at: Vg=+15 V, Vd=0 V, and after lapse of the predetermined, time=$10^4$ seconds.

On the other hand, for NBIS, a predetermined negative voltage is applied as Vg, Vd is 0 V, and light of a halogen lamp having a predetermined wavelength is applied at a predetermined illuminance, and the threshold voltage Vth is measured after lapse of a predetermined time. Then, a difference to the previously measured initial threshold voltage is determined, and defined as a threshold voltage shift amount $\Delta Vth$.

In this embodiment, conditions are set for NBIS such that Vg=−15 V, Vd=0 V, lapse of the predetermined time=$10^4$ sec, the predetermined wavelength=305 nm to 3,000 nm, and the predetermined illuminance=1300 lux. When the TFT is applied to an OLED device to be described later, the predetermined, wavelength of light is defined as within a range of 400 to 800 nm.

Figure 2:
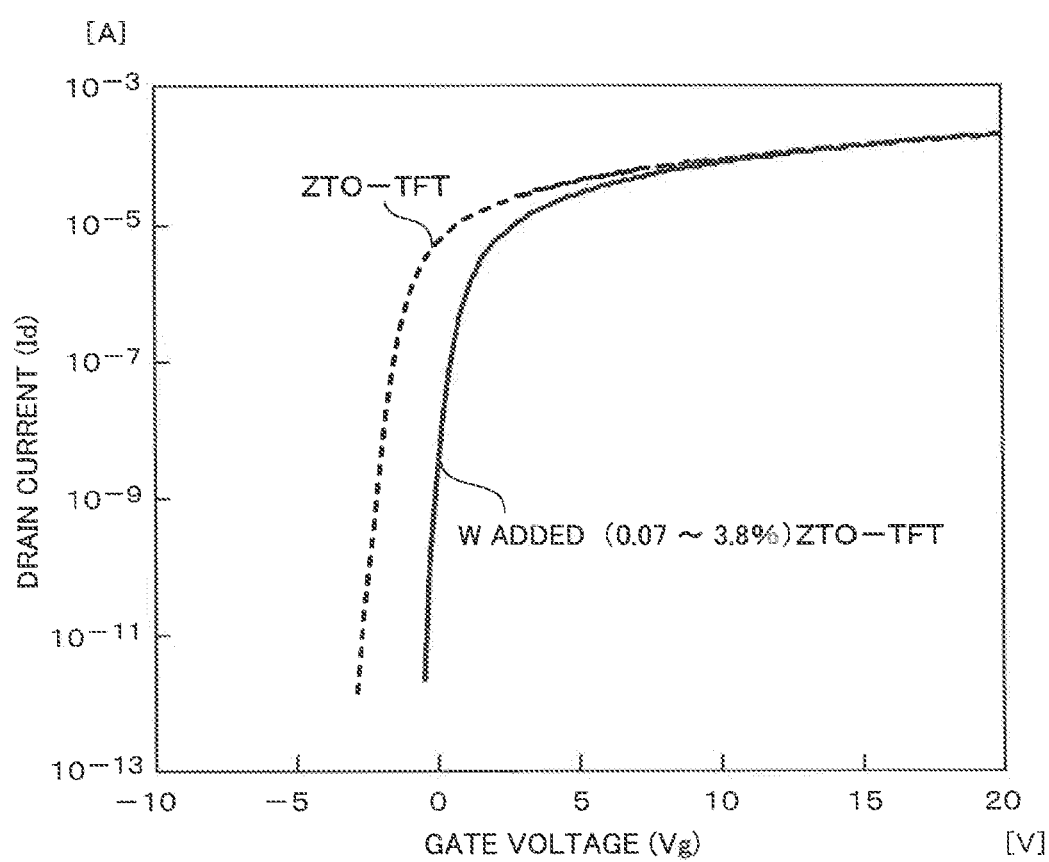
FIG. 2 is a graph illustrating a relation between the gate voltage (Vg) and the drain current (Id) described in a first embodiment.

In FIG. 2, the addition amount of W is indicated as 0.07 to 3.8 at %. FIG. 2 shows current-voltage characteristics (Id-Vd) when W is added, by 0.07 at % W to ZTO. In view of the graph, it has been found that the threshold voltage of the TFT is shifted to the vicinity of 0 V by the addition of W. In the same manner, since the threshold voltage of about 0 V is obtained also by other addition amounts of W (addition amount up to 3.8 at. %), the addition amount of W is indicated as 0.07 to 3.8 at % in FIG. 2 based on the result.

Figure 6:
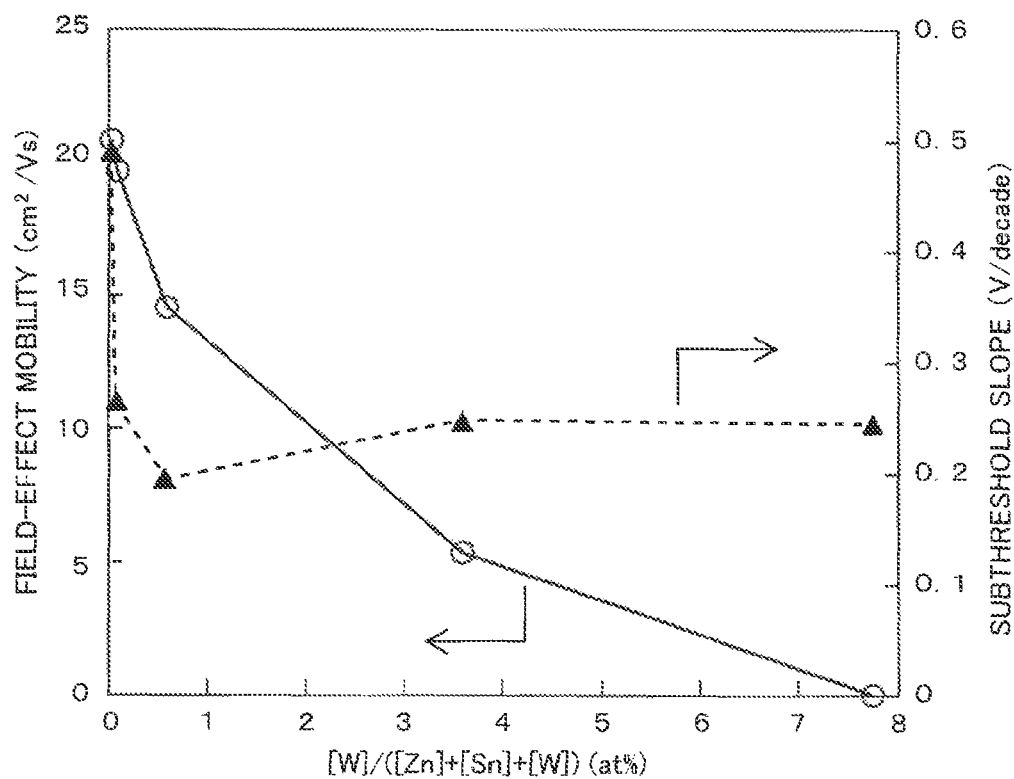
FIG. 6 is a graph illustrating a relation of field-effect mobility and a subthreshold slope of the TFT to the addition amount of tungsten oxide of the thin film transistor illustrated in the first embodiment of the invention.
Figure 7:
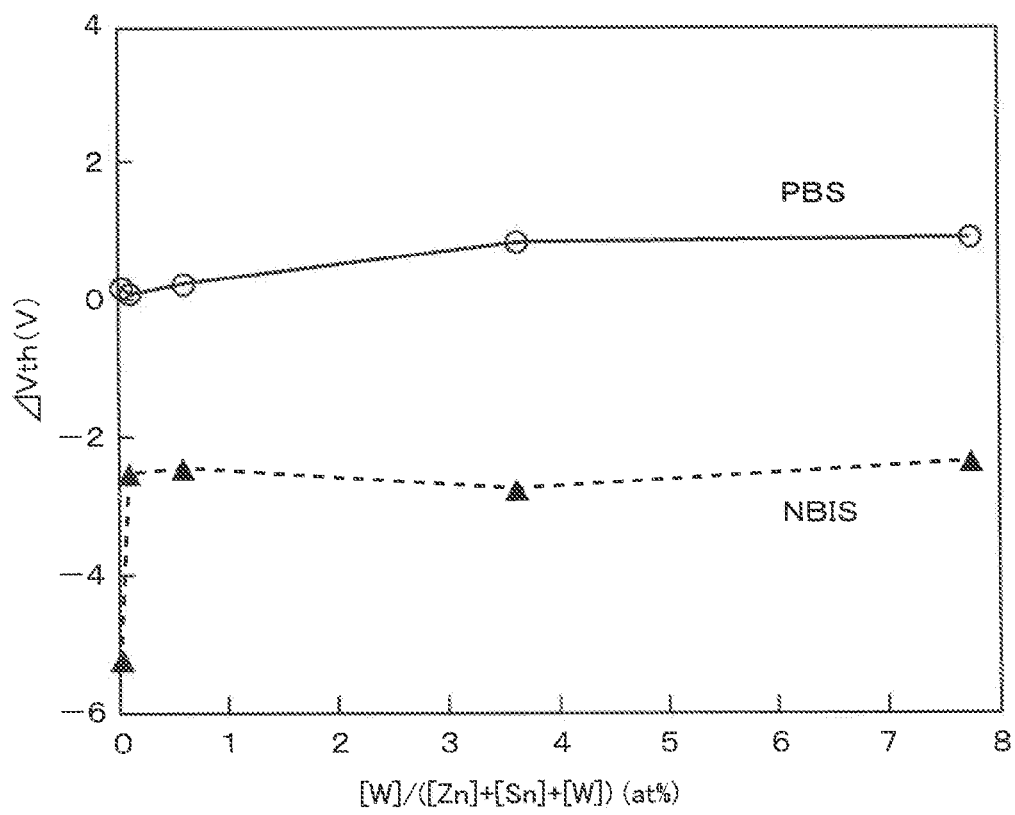
FIG. 7 is a graph illustrating a relation of PBS and NBIS of the TFT to the addition amount of tungsten oxide of the thin film transistor illustrated in the first embodiment of the invention.

FIGS. 6 and 7 show the result of measurement on the TFT manufactured by using the sintered target in which the addition amount of W described above is within a range of 0 to 7.8 at %.

FIG. 6 illustrates a relation of the field-effect mobility and the subthreshold slope to the addition amount of W of the manufactured TFT. In view of the graph, since the field-effect mobility lowers as the addition amount of W increases, it has been found that the addition amount of W should be 3.8 at % or less in order to attain the field-effect mobility of 5 $cm^2/Vs$ or more.

Meanwhile, the subthreshold slope of the TFT tends to be saturated at the addition amount W of 0.07 at % or more and has a value of about 0.24 V/decade.

FIG. 7 illustrates a relation of the PBS and the NIBS to the addition amount of W of the manufactured TFT. The PBS is represented by the value of ΔVth at Vg=15 V, Vd=0 V, and after lapse of $10^4$ sec. The NBIS is represented by the value of ΔVth at Vg=−15 V, Vd=0 V, and $10^4$ sec after illumination of a halogen lamp at a wavelength of 305 nm to 3000 nm at an illuminance of 1300 lux. When the TFT is applied to the OLED display device, it is necessary to confirm the resistance against light in a wavelength region of 400 to 800 nm and a simulation test is performed by halogen lamp illumination.

As shown in the graph, ΔVth changes greatly from −3 V when W is not added. On the other hand, the second plot from the left of the data in the graph shows ΔVth when W is added by 0.07 at %. By adding 0.07 at % of W as shown in the graph, it has been found that the resistance against light stress is improved and a Vth value within −3 V is obtained.

In view of the above, a thin film transistor having the field-effect mobility of 5 $cm^2/Vs$ or more and the ΔVth within ±3 V can be obtained by defining the addition amount of W to 0.07 to 3.8 at %. More preferably, the addition amount of W capable of attaining the field-effect mobility of 10 $cm^2/Vs$ or more and the ΔVth within ±3 V is from 0.07 to 2.0 at %.

While a description has been made in this embodiment with reference to the [Zn]/([Zn]+[Sn]) compositional ratio of 0.6, the compositional ratio is not restricted thereto. It has been confirmed that substantially identical values are obtained tor the characteristics of the thin film transistor per se over the entire range of the [Zn]/([Zn]+[Sn]) compositional ratio of 0.5 to 0.85 defined in this invention although characteristics of wet etching are somewhat varied. While the magnetron sputtering is used for the deposition method, a substantially identical result can be obtained for the manufactured sintering target also by using an ECR sputtering method. Further, an identical result can be obtained also by a vapor deposition method in addition to the sputtering. In addition, oxide semiconductor single crystals and a device using them can also be manufactured in addition to the thin film transistor by using pulse laser vapor deposition, etc. and using a single crystal substrate capable of epitaxial growing. Further, while the embodiment has been described with reference to the example of the bottom gate top contact type thin film transistor, the structure is not particularly restricted but substantially identical characteristics can be obtained also in the thin film transistors of any other structure of a bottom gate bottom contact type, a top gate top contact type, and a top gate bottom contact type. The thin film transistors can be utilized with no problems also as the transistor for driving active matrix liquid crystal displays, current driving devices for OLED, and RFID tag devices.

The invention of this embodiment is not restricted to the constitution described above but may be modified variously within the range not departing the technical idea of the invention. Further, this embodiment can be used in an appropriate combination with other embodiment.

Second Embodiment

A second embodiment is different from the first embodiment in the invention in that Ta is used instead of W as an additive element. Like the first embodiment, powders of zinc oxide and tin oxide at high purity are weighed respectively to molar amounts so as to provide a [Zn]/([Zn]+[Sn]) compositional ratio of 0.6 and then a powder of tantalum oxide is added such that the addition amount of Ta is 0 to 6.5 at % to manufacture a sintered target. A thin film transistor is manufactured by using the target. Detailed processes for manufacturing the target are identical with those described in the first embodiment.

It can be confirmed that ZTO with addition of Ta has an etching rate of about 0.05 nm/min. to an Al etching solution and has high etching resistance.

Like the first embodiment, it has been confirmed based on the current-voltage characteristics of the thin film transistor that the threshold voltage is shifted to the vicinity of 0 V when Ta is added by 0.5 at % or more.

Figure 8:
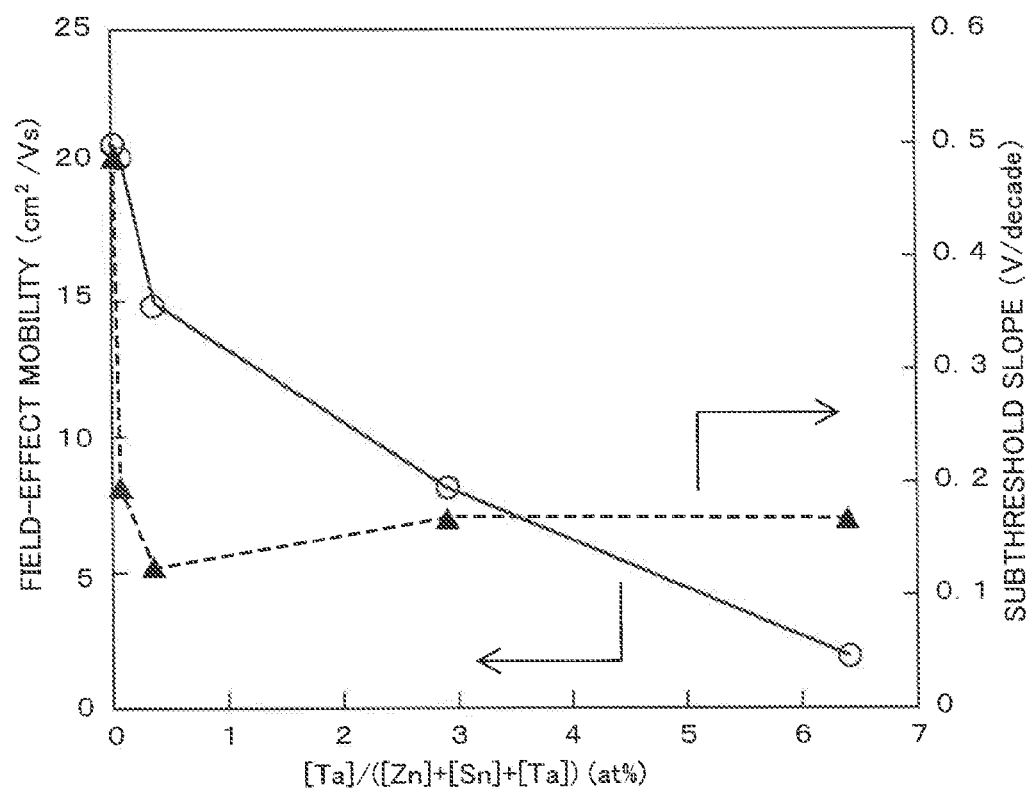
FIG. 8 is a graph illustrating a relation of the field-effect mobility and the subthreshold slope of the TFT to the addition amount of tantalum oxide of the thin film transistor illustrated in the second embodiment of the invention.

FIG. 8 illustrates a relation of the field-effect mobility and the subthreshold slope of the manufactured TFT to the addition amount of Ta. In view of the graph, it has been found that the field-effect mobility lowers as the addition amount of Ta increases and the addition amount of Ta should be 4.5 at % or less in order to obtain the field-effect mobility of 5 $cm^2/Vs$ or more. The subthreshold slope of the TFT tends to be saturated, at the addition amount of Ta of 0.01 at % or more and has a value of about 0.2 V/decade.

Figure 9:
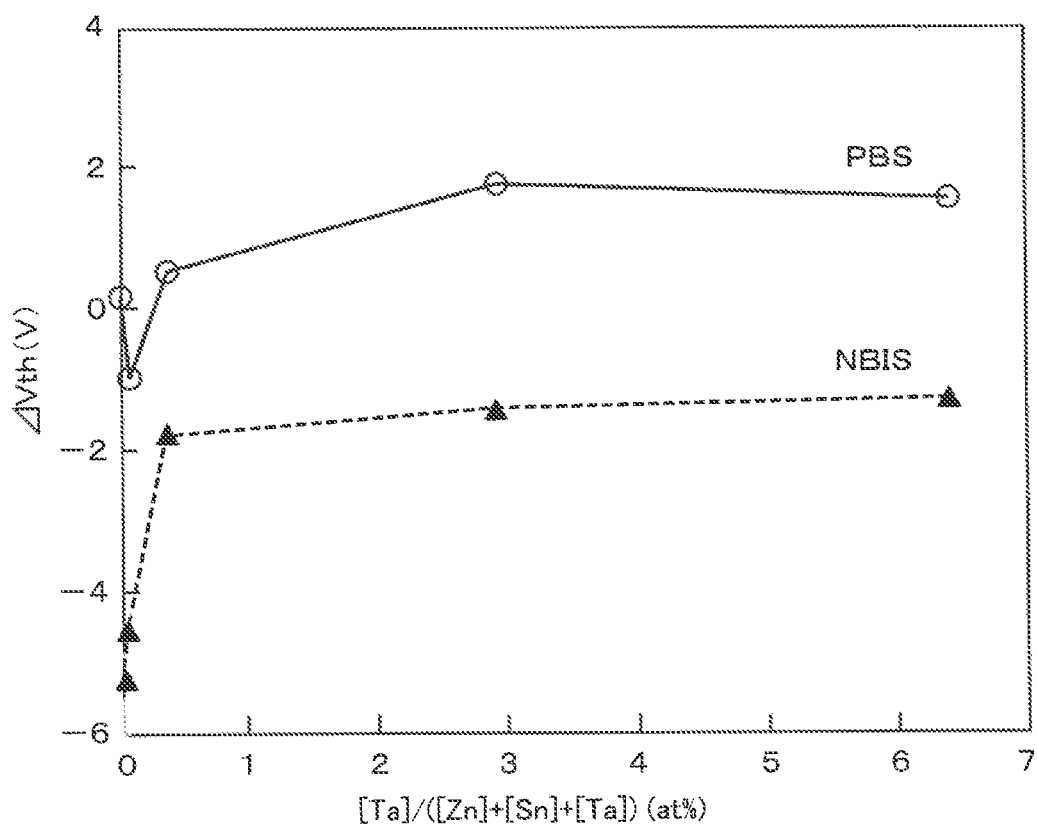
FIG. 9 is a graph illustrating a relation of PBS and NBIS of the TFT to the addition amount of tantalum oxide of a thin film transistor shown in a second embodiment of the invention.

FIG. 9 illustrates a relation of the PBS and the NIBS of the manufactured TFT to the addition amount of Ta. The PBS is represented, by a value of the ΔVth at Vg=15 V, Vd=0 V, and after elapse of $10^4$ sec. NBIS is represented by a value of the ΔVth at Vg=−15 V, Vd=0 V, and $10^4$ sec after halogen lamp illumination at a wavelength of 305 nm to 3,000 nm and at an illuminance of 1300 lux. When the TFT is applied to the OLED, it is necessary to confirm the resistance against light at a wavelength within a region of 400 to 800 nm, and a simulation test is performed by halogen lamp illumination. As shown in this graph, the resistance against light stress is improved by adding Ta by 0.5 at % or more and a value of ΔVth within −3 V is obtained.

In view of the above, a thin film transistor having a field-effect mobility of 5 $cm^2/Vs$ or more arid the ΔVth within ±3 V can be obtained by defining the addition amount of Ta to 0.5 to 4.7 at %. More preferably, the addition amount of Ta capable of attaining the field-effect mobility of 10 $cm^2/Vs$ or more and the ΔVth within ±3 V is from 0.5 to 2.2 at %.

While a description has been made in this embodiment with reference to the [Zn]/([Zn]+[Sn]) compositional ratio of 0.6, the compositional ratio is not restricted thereto. It has been confirmed that substantially identical values are obtained for the characteristics of the thin film transistor per se over the entire range of the [Zn]/([Zn]+[Sn]) compositional ratio of 0.5 to 0.85 defined in this invention although characteristics of wet etching are somewhat varied. While the magnetron sputtering is used for the deposition method, a substantially identical result can be obtained for the manufactured sintering targets also by using an ECR sputtering method. Further, an identical result can be obtained also by a vapor deposition method in addition to the sputtering. In addition, oxide semiconductor single crystals and a device using them can also be manufactured in addition to the thin film transistor by using pulse laser vapor deposition, etc. and using a single crystal substrate capable of epitaxial growing.

Further, while the embodiment has been described with reference to the example of the bottom, gate top contact type thin film transistor, the structure is not particularly restricted but substantially identical characteristics can be obtained also in the thin film transistors of any other structure of a bottom gate bottom contact type, a top gate top contact type, and a top gate bottom contact type. The thin film transistors can be utilized with no problems also as the transistor for driving active matrix liquid crystal displays, current driving devices for OLED, and RFID tag device.

Third Embodiment

A third embodiment is different from the first embodiment of the invention in that Hf is used instead of W as an additive element. Like the first embodiment, powders of zinc oxide and tin oxide at high purity are weighed respectively to molar amounts so as to provide a [Zn]/([Zn]+[Sn]) compositional ratio of 0.6 and then a powder of hafnium oxide is added such that the addition amount of Hf is 0 to 7.3 at % to manufacture a sintered target. A thin film transistor is manufactured by using the target. Detailed process for manufacturing the target is identical with that described for the first embodiment.

It can be confirmed that ZTO with addition of Hf has an etching rate of about 0.05 nm/min. to an Al etching solution and has high etching resistance.

Like the first embodiment, it has been confirmed based on the current-voltage characteristics of the thin film transistor that the threshold voltage is shifted to the vicinity of 0 V when Hf is added, by 0.32 at % or more.

Figure 10:
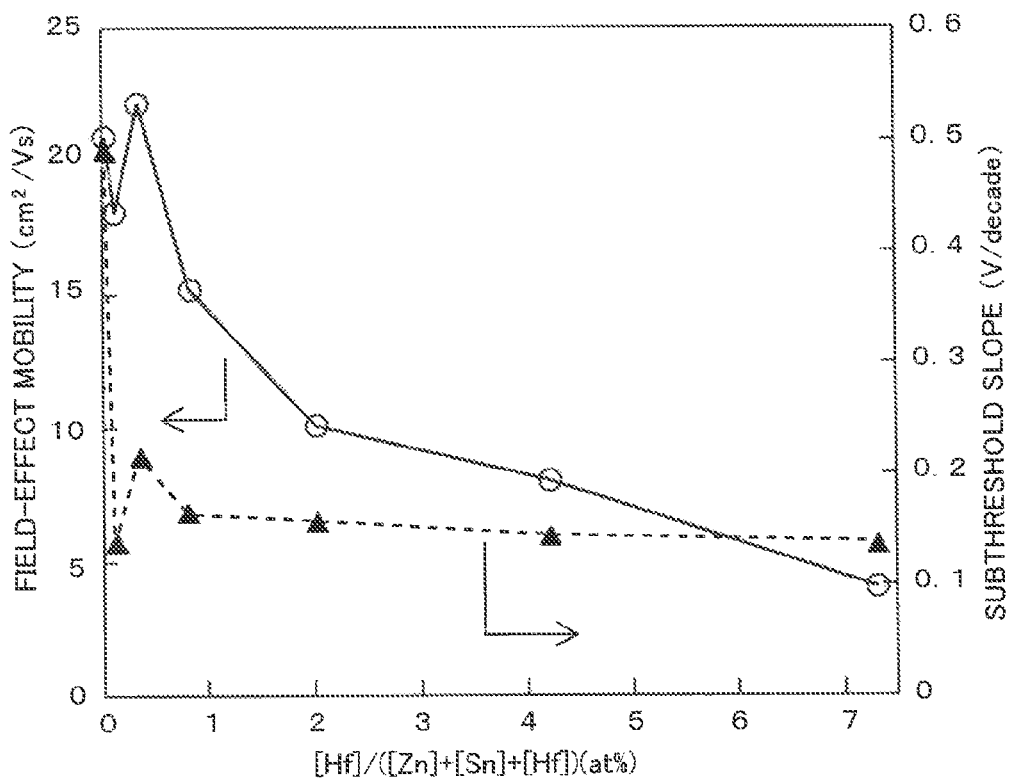
FIG. 10 is a graph illustrating a relation of the field-effect mobility and the subthreshold slope of the TFT to the addition amount of hafnium oxide of the thin film transistor shown in a third embodiment of the invention.

FIG. 10 illustrates a relation of the field-effect mobility and the subthreshold slope of the manufactured TFT to the addition amount of Hf. In view of the graph, it has been found that the field-effect mobility lowers as the addition amount of Hf increases and the addition amount of Hf should be 6.4 at % or less in order to obtain the field-effect mobility of 5 cm$^2$/Vs or more. The subthreshold slope of the TFT tends to be saturated at the addition amount of Hf of 0.1 at % or more and has a value of about 0.15 V/decade.

Figure 11:
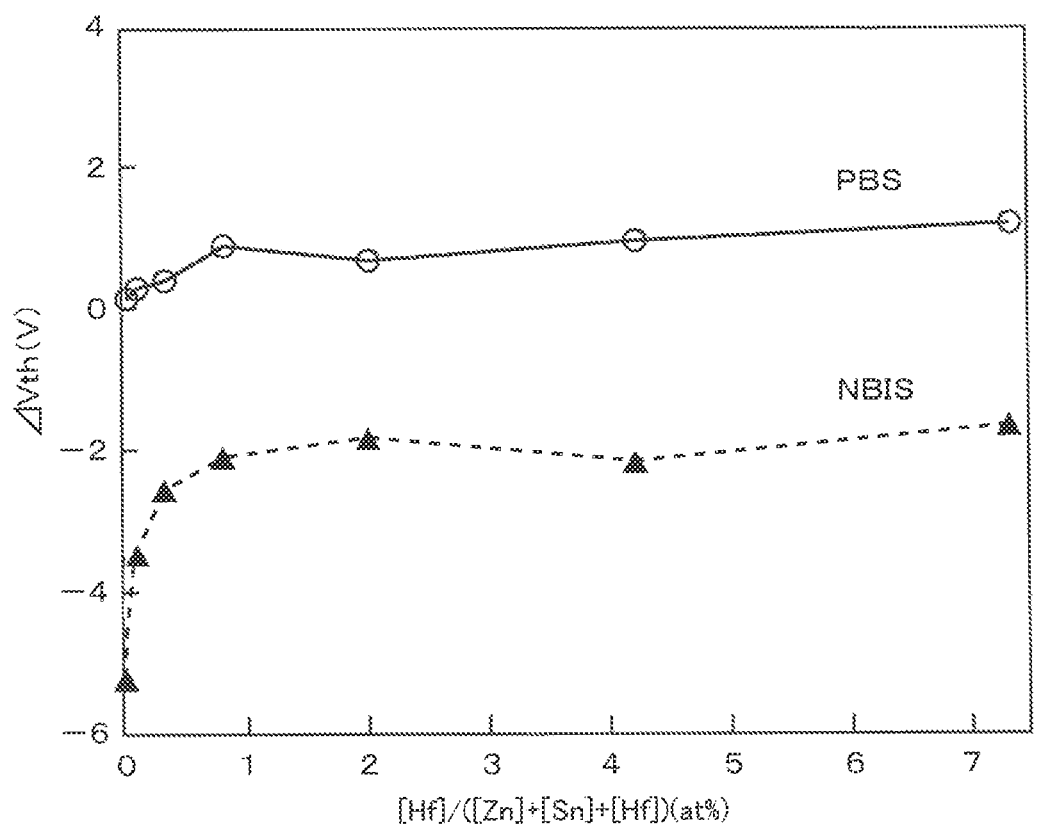
FIG. 11 is a graph illustrating a relation of PBS and NBIS of TFT to the addition amount of hafnium oxide of the thin film transistor illustrated in the third embodiment of the invention.

FIG. 11 illustrates a relation of the PBS and the NIBS of the manufactured TFT to the addition amount of Hf. The PBS is represented, by a value of the ΔVth at Vg=15 V, Vd=0 V and after lapse of 10$^4$ sec. NBIS is represented, by a value of the ΔVth at Vg=-15 V, Vd=0 V, and 10$^4$ sec after halogen lamp illumination at a wavelength of 305 nm to 3,000 nm and at an illuminance of 1300 lux. When the TFT is applied to the OLED, it is necessary to confirm the resistance against light at a wavelength within, a region of 400 to 800 nm, and a simulation test is performed by halogen lamp illumination. As shown in this graph, the resistance against light stress is improved by adding Hf by 0.32 at % or more and a value of the ΔVth within −3 V is obtained.

In view of the above, a thin film transistor having the field-effect mobility of 5 cm$^2$/Vs or more and the ΔVth within ±3 V can be obtained by defining the addition amount of Hf to 0.32 to 6.4 at %. More preferably, the addition amount of Hf capable of attaining the field-effect mobility of 10 cm$^2$/Vs or more and the ΔVth within ±3 V is from 0.32 to 2.1 at %.

While a description has been made in this embodiment with reference to the [Zn]/([Zn]+[Sn]) compositional ratio of 0.6, the compositional ratio is not restricted thereto. It has been confirmed that substantially identical values are obtained for the characteristics of the thin film transistor per se over the entire range of the [Zn]/([Zn]+[Sn]) compositional ratio of 0.5 to 0.85 defined in this invention although characteristics of wet etching are somewhat varied. While the magnetron sputtering is used for the deposition method, a substantially identical results can be obtained for the manufactured sintering targets also by using an ECR sputtering method. Further, an identical result can be obtained also by a vapor deposition method in addition to the sputtering. In addition, oxide semiconductor single crystals and a device using them can also be manufactured in addition to the thin film transistor by using pulse laser vapor deposition, etc. and using a single crystal substrate capable of enabling epitaxial growing. Further, while the embodiment has been described with reference to the example of the bottom gate top contact type thin film transistor, the structure is not particularly restricted but substantially identical characteristics can be obtained also in the thin film transistors of any other structure of a bottom gate bottom contact type, a top gate top contact type, and a top gate bottom contact type.

While only W, Ta, and Hf are shown as specific examples of the 5d transition metal, it is expected that an identical effect is obtained also by other 5d transition metal oxides. However, it is considered that the optimal addition amount is different depending on the material and this is beyond simple and easy control of the addition amount even to persons skilled in the art. The thin film transistors can be utilized with no problem also as the transistor for driving active matrix liquid crystal displays, a current driving device for organic electroluminescent derives, and RFID tag devices.

As has been described, so far for the first embodiment to the third embodiment, the ΔVth can be controlled within −3 V for improving the resistance against the light stress by adding W by 0.07 at % or more, adding Ta by 0.5 at % or more, and adding Hf by 0.32 at % or more.

That is, W can improve the resistance against the light stress with a smaller addition amount than that of other metals (Ta and Hf) of the 5d transition metal. Thus, the capability of providing the effectiveness by the addition of the smaller amount means that a more stable resistance against the light stress can be ensured against scattering of the addition amount in the production. Accordingly, addition of W is more preferred and advantageous in the invention.

For the subthreshold slope, any of W, Ta, and Hf shows substantially an identical effect within a range of satisfying the resistance against the light stress in FIGS. 6, 8, and 10.

Fourth Embodiment

This embodiment is different from the first embodiment to the third embodiments in that two or more of W, Ta, and Hf are selected and added as the additive element. Like the first embodiment, powders of zinc oxide and tin oxide at high purity are weighed respectively to molar amounts so as to provide a [Zn]/([Zn]+[Sn]) compositional ratio of 0.6. Then, a tungsten oxide powder, a tantalum oxide powder, send a hafnium oxide powder are controlled, assuming the maximum addition amounts thereof obtained in the first embodiment to the third embodiment (addition amount capable of obtaining the field-effect mobility of the TFT of 5 cm$^2$/Vs or more) as 1, normalizing each of the additive elements by the maximum addition amount thereof, and within such a range that the total for each of the normalized addition amounts does not exceed 1. Thus, the upper limit of the addition amount can be defined.

Then, each of the oxide powders is controlled, assuming the minimum addition amount obtained in the first embodiment to the third embodiment (addition amount capable of improving resistance against the light stress of the TFT ($\Delta Vth \leq \pm 3$ V)) as 1, normalizing each of the additive elements by the minimum, addition, amount and within such a range that the total for each of the normalized addition amounts is 1 or more. Thus, the lower limit of the addition amount can be defined.

This embodiment shows an example of adding all of three kinds of W, Ta, and Hf. For example, W is added by 10% (3.8×0.1=0.38 at %), Ta is added by 5% (4.7×0.05=0.23 at. %), and Hf is added by 20% (6.4×0.2=1.28 at %), to manufacture a sintered target. A thin film transistor is manufactured by using the target.

In this embodiment, 3.8 at % of W as the maximum addition amount, 4.7 at % of Ta as the maximum addition amount, and 6.4 at % of Hf as the maximum addition amount are used. Further, the addition amounts of the respective materials, that is, 10% (0.1) of W, 5% (0.05) of Ta, and 20% (0.2) of Hf are controlled within such a range that the total of each of the normalized addition amounts does not exceed 1 (100%).

It can be confirmed that ZTO with addition of W, Ta, and Hf has an etching rate of about 0.05 nm/min. to the Al etching solution and has a high etching resistance.

Like the first embodiment, it has been confirmed that the threshold voltage of the TFT is shifted to the vicinity of 0 V and also that 5 cm$^2$/Vs or more of the field-effect mobility of TFT is obtained when W, Ta, and Hf are added based on the current-voltage characteristics of TFT.

The PBS and the NIBS of the TFT with addition of W, Ta, and Hf are evaluated. The PBS is represented by the Vth value at Vg=1.5 V, Vd=0 V and after lapse of $10^4$ sec. The NBIS is represented by the Vth value at Vg=−15 V, Vd=0 V, and $10^4$ sec after halogen lamp illumination at a wavelength within a range of 305 nm to 3,000 nm and at an illuminance of 1300 lux. In the application of the TFT to the OLED device, it is necessary to confirm the resistance against the light within a wavelength region of 400 to 800 nm, and a simulation test has been performed by halogen lamp illumination. The resistance against the light stress is improved by adding W, Ta and Hf in a predetermined range and a $\Delta$Vth at a value within −3 V is obtained for the manufactured TFT.

While a description has been made in this embodiment with reference to the [Zn]/([Zn]+[Sn]) compositional ratio of 0.6, the compositional ratio is not restricted thereto. When the Zn ratio: [Zn]/([Zn]+[Sn]) is 0.5, an etching performance of 0.03 nm/min, is shown and when the Zn ratio is 0.85, etching performance of about 0.08 nm/min. is shown to the Al etching solution. Further, for the entire region of [Zn]/([Zn]+[Sn]) compositional ratio of 0.5 to 0.85, it has been confirmed that the characteristics of the thin film, transistor per se are substantially identical and the field-effect mobility of 5 cm$^2$/Vs or more and the $\Delta$Vth within −3 V can be obtained. While the magnetron sputtering is used for the deposition method, a substantially identical result can be obtained for the manufactured sintered target also by using an ECR sputtering method. Further, as identical result can be obtained also by a vapor deposition method in addition to the sputtering. Further, oxide semiconductor single crystals and a device of using them can also be manufactured in addition to the thin film transistor by using pulse laser vapor deposition, etc. and using a single crystal substrate capable of epitaxial growing.

Further, while the embodiment has been described with reference to the example of the bottom gate top contact type thin film transistor, the structure is not particularly restricted but substantially identical characteristics can be obtained also in the thin film transistors of any other structure of bottom gate bottom contact type, top gate top contact type, and top gate bottom contact type. The thin film transistors can be utilized with no problems, for example, as a transistor for driving active matrix liquid crystal displays, a current driving device for organic EL devices, RFID tag devices, etc.

Fifth Embodiment

Figure 12:
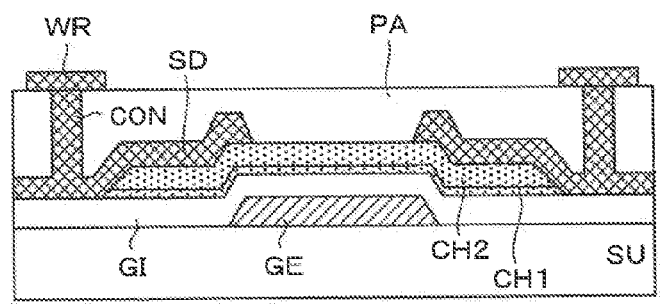
FIG. 12 is a cross sectional view of a thin film transistor shown in a fourth embodiment of the invention.

This embodiment is different from the first embodiment to the fourth embodiments in that the oxide semiconductor layer includes two or more layers. FIG. 12 is a view illustrating the configuration of a semiconductor device of the fifth embodiment. As illustrated in the drawing, at first, after forming a gate electrode GE, and a gate insulation film GI, a first semiconductor layer CH1 and a second semiconductor layer CH2 are deposited continuously and they are fabricated by the combination of usual photolithography and wet etching or dry etching for the device isolation. While ZTO with addition of the 5d transition metal oxide may be used for the first semiconductor layer CH1, the first semiconductor layer CH1 can be formed by using an oxide, for example, In—O, In—Zn—O, In—Sn—O, In—Ga—O, Sn—O, In—Ga—Zn—O, and Zn—Sn—O, and composite oxides thereof having less stability to the light stress. The second semiconductor layer CH2 is formed of ZTO with addition of the 5d transition metal oxide described in the first embodiment to the fourth embodiment. They are deposited, for example, by a sputtering method, a PLD method, a CVD method, a coating method, and a printing method. In this embodiment, the first semiconductor layer CH1 is formed by using In—Sn—O (In:S=93.7) under the conditions at a gas pressure of 0.5 Pa (Ar+10% $O_2$), a DC power of 50 W and at a growing temperature (room temperature) by a sputtering method. The thickness of the first semiconductor layer is preferably about 3 to 25 nm. The second semiconductor layer CH2 is formed by using ZTO (Zn:Sn=50:50) with addition of 1.0 at % of Ta under the conditions at a gas pressure of 0.5 Pa (Ar+20% $O_2$), by a DC power of 50 W and at a growing temperature (room temperature) by a sputtering method. The thickness of the second semiconductor layer is preferably about 5 to 75 nm.

Then, when a contact hole (not illustrated) is formed for connection of a source drain electrode layer SD to be formed subsequently and the gate electrode layer GE, a contact hole of a desired shape (not illustrated) is formed by wet etching or dry etching of the gate insulation layer G1 using a photoresist film as an etching mask.

Then, the source/drain electrode SD is deposited and shaped by the combination of usual photolithography and dry etching or wet etching.

Then, after forming a protective film PA and a contact hole CON for electric connection, an interconnect layer WR is formed and annealing is applied, optionally at 300 to 450° C., to manufacture a specimen.

The manufacturing TFT shows identical characteristics with those of the TFT manufactured in the first embodiment, and has a threshold voltage of about 0 V. Further, the field-effect mobility is 30 cm²/Vs or more and the subthreshold slope is 0.15 V/decade. As a result of a light stress test, the Δth is within ±3 V and high resistance against the light stress is shown. In view of the result, even when a material not having resistance against the light stress is used for the first semiconductor layer CH1, the manufactured TFT can obtain high resistance against the light stress by using the second semiconductor layer CH2 having resistance against the light stress. The thin film transistors can be utilized with no problems, for example, as a transistor for driving active matrix liquid crystal displays, a current driving device for organic EL devices, RFID tag devices, etc.

While a description has been made in this embodiment with reference to a case of the [Zn]/([Zn]+[Sn]) compositional ratio of 0.6, the compositional ratio is not particularly restrictive. An etching performance of 0.03 nm/min. is shown when the Zn ratio [Zn]/([Zn]+[Sn]) is 0.5 and an etching performance of about 0.08 nm/min. is shown when the Zn ratio is about 0.85 to the Al etching solution. Further, for the entire region of the [Zn]/([Zn]+[Sn]) compositional ratio of 0.5 to 0.85, it has been confirmed that characteristics of the thin film transistor per se are substantially identical and the field-effect mobility of 5 cm²/Vs or more and the ΔVth within −3 V can be obtained.

Sixth Embodiment

Figure 13:
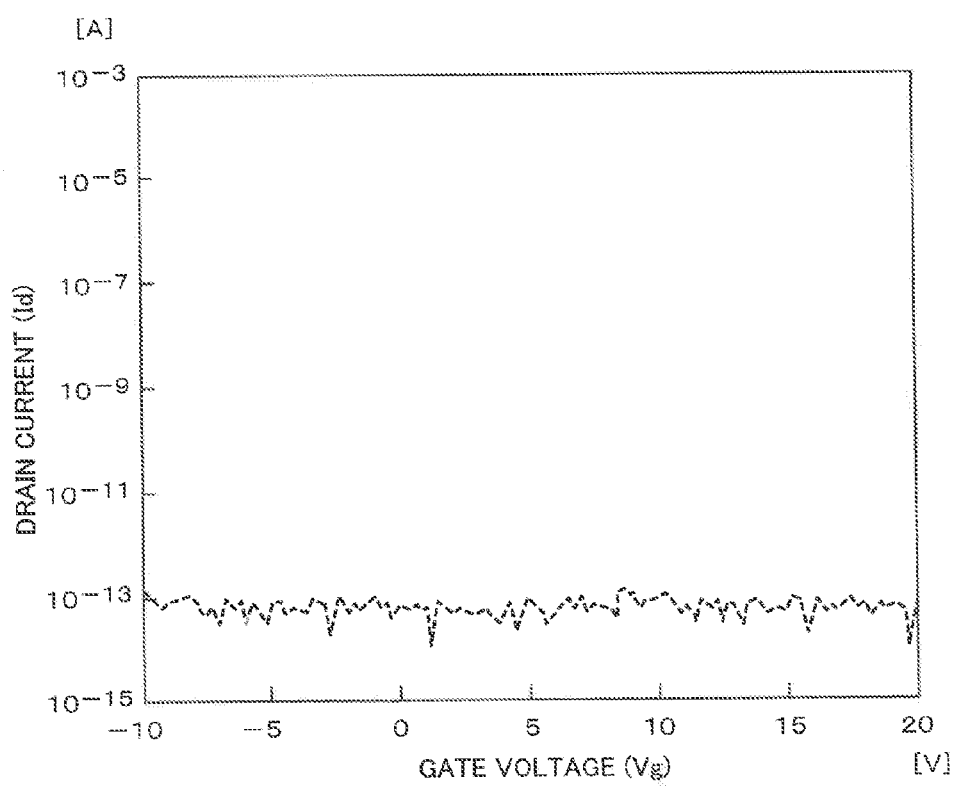
FIG. 13 is a graph illustrating current-voltage characteristics of a protective film illustrated, in a fifth embodiment of the invention.

This embodiment is different from the first embodiment to the fifth embodiment in that the addition amount of the oxide of 5d transition metal, is increased and ZTO is applied as the protective film to the thin film transistor. FIG. 13 is a graph showing current-voltage characteristics of ZTO with addition of 8 at % of W. In view of the graph, electric characteristics identical with those of an insulator are shown when the addition amount of W is 8 at % or more. Further, when the characteristics are investigated in the same manner also for Ta and Hf, electric characteristics identical with those of the insulation film are shown at the addition amount of 9 at % or more for Ta and at the addition amount of 11 at % or more for Hf. Based on the result, application to the protective film is possible by increasing the addition amount of the additive element (one or more of W, Ta, and Hf).

Figure 14:
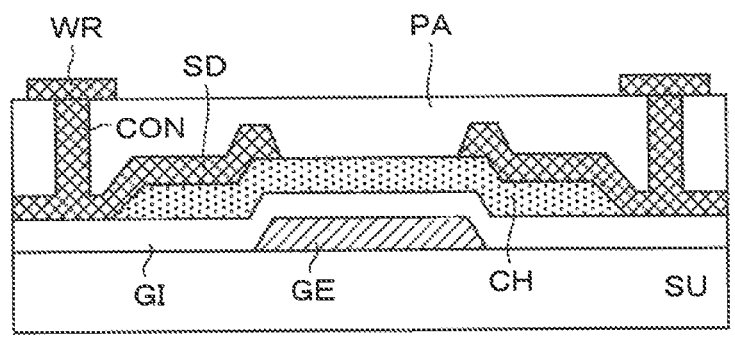
FIG. 14 is a cross sectional view of a thin film transistor having a protective film illustrated in the fifth embodiment of the invention.

FIG. 14 illustrates a cross sectional view of a thin film transistor in which ZTO that can be manufactured, by addition of one or more of W, Ta, and Hf is applied to the protective film. As show in the drawing, after forming a gate electrode GE and a gate insulation film GI, an oxide semiconductor layer CH is deposited and the oxide semiconductor layer CH is fabricated by the combination of usual photolithography and wet etching or dry etching for device isolation. While ZTO with addition of an oxide of the 5d transition metal oxide may be used for the oxide semiconductor layer CH, the oxide semiconductor layer CH can be formed of an oxide, for example, In—O, In—Zn—O, In—Sn—O, In—Ga—O, Sn—O, In—Ga—Zn—O, and Zn—Sn—O, and composite oxides thereof which are less stable to light stress. They are deposited, for example, by a sputtering method, a PLD method, a CVD method, a coating method, and a printing method. In this embodiment, the thin film transistor is formed by using Zn—Sn—O (Zn:Sn=85:15) for the oxide semiconductor layer CH under the conditions at a gas pressure of 0.5 Pa (Ar+10% O2), by a DC power of 50 W, and at a growing temperature (room temperature). The thickness of the oxide semiconductor layer is preferably about 3 to 75 nm.

Then, when a contact hole (not illustrated) is formed for connection of a source/drain electrode layer SD to be formed subsequently and a gate electrode layer GE, a contact hole of a desired shape (not illustrated) is formed by wet etching or dry etching of the gate insulation layer G1 using a photoresist film as an etching mask.

Then, the source/drain electrode SD is deposited and shaped by the combination of usual photolithography and dry etching or wet etching.

Then, Zn—Sn—O (Zn:Sn=60:40) with addition of 8 at % of W is formed as a protective film at a gas pressure of 0.5 Pa (Ar+30% O₂), by an Rf power of 50 W, and at a growing temperature (room temperature) by a sputtering method. The thickness of the oxide semiconductor layer is preferably about 100 to 300 nm.

Then, after forming a contact hole CON for electric connection, an interconnect layer WR is formed and annealing is applied optionally at 300 to 450° C., to manufacture a specimen.

The manufacturing TFT shows identical characteristics with those of the TFT manufactured in the first embodiment, and has a threshold voltage of about 0 V. Further, the field-effect mobility is 20 cm²/Vs or more and the subthreshold slope is 0.2 V/decade. As a result of a light stress test, the ΔVth is within ±3 V and high resistance against the light stress is shown. In view of the result, even when a material not having resistance against the light stress is used, for the oxide semiconductor layer CH, the manufactured TFT can obtain a high resistance against the light stress by using the protective film PA having resistance against the light stress. The thin film transistors can be utilized with no problems, for example, as transistors for driving active matrix liquid crystal displays, current driving devices for organic EL devices, RFID tag devices, etc.

While a description has been made in this embodiment with reference to a case of a [Zn]/([Zn]+[Sn]) compositional ratio of 0.6, the compositional ratio is not particularly restrictive. An etching performance of 0.03 nm/min. is shown when the Zn ratio [Zn]/([Zn]+[Sn]) is 0.5, and an etching performance of about 0.06 nm/min. is shown when the Zn ratio is 0.85 to the Al etching solution. Further, over the entire region of [Zn]/([Zn]+[Sn]) compositional ratio of 0.5 to 0.85, it has been confirmed that characteristics of the thin film transistor per se are substantially identical, and the field-effect mobility of 5 cm²/Vs or more and the ΔVth within −3 V are obtained.

Seventh Embodiment

There is no restriction to the application of the thin film transistors and the protective films having been described in the first embodiment to the sixth embodiment, and they can be applied, for example, to active matrix substrates (array substrate) used in electro-optical devices such as OLED display devices.

Figure 15:
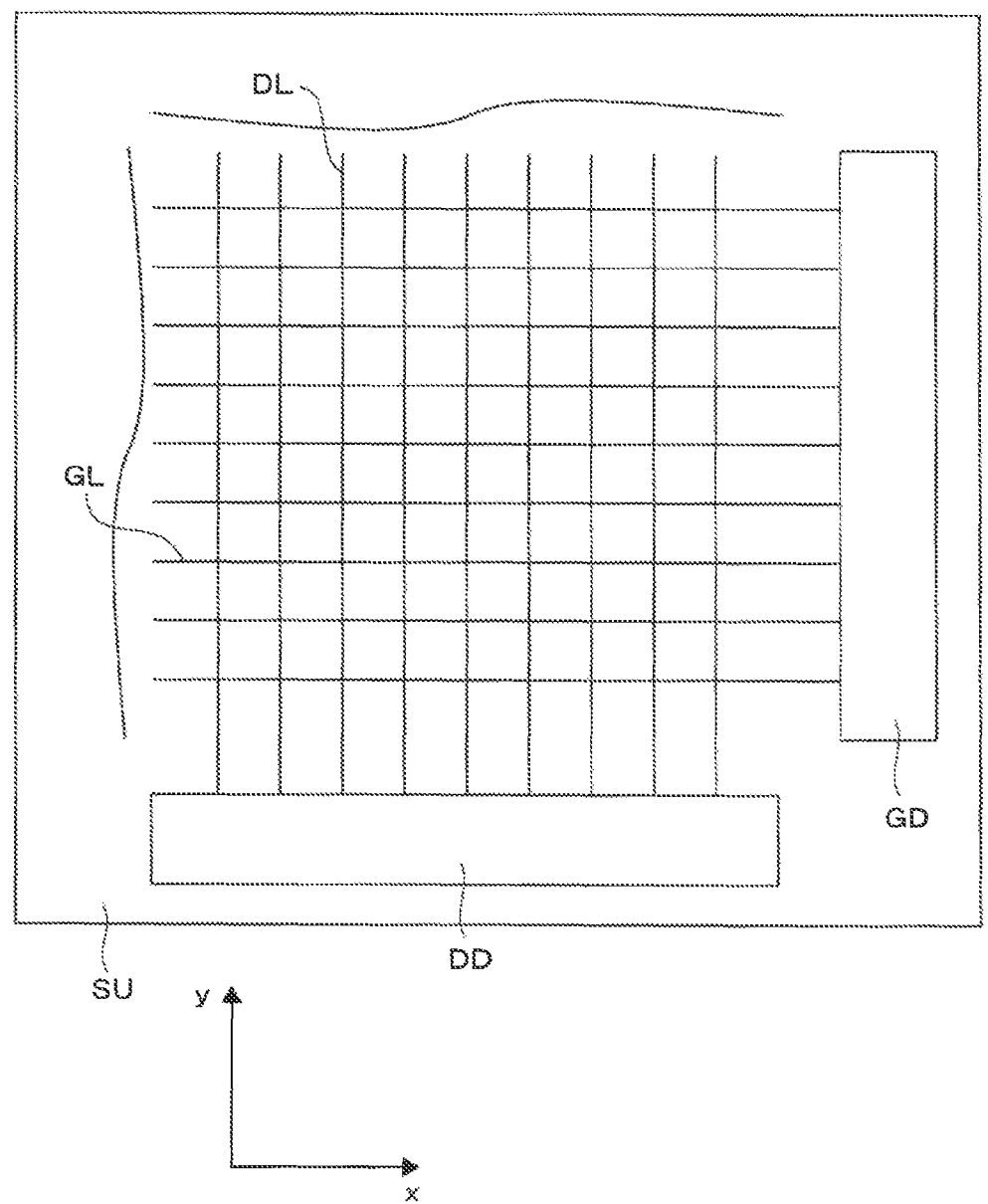
FIG. 15 is a schematic circuit diagram illustrating a configuration of applying an oxide semiconductor device in a sixth embodiment of the invention to an active matrix OLED display device.
Figure 16:
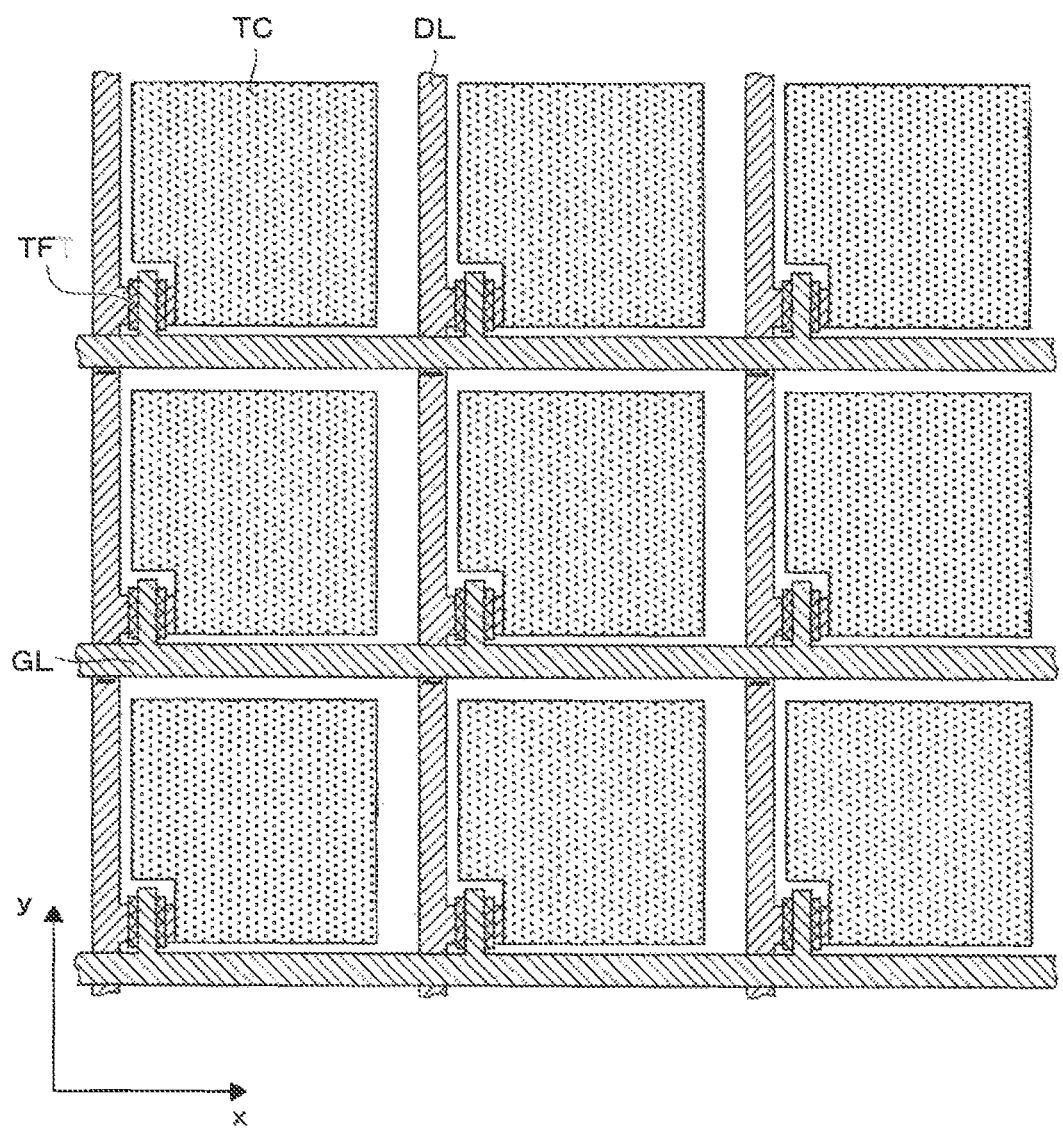
FIG. 16 is a schematic circuit diagram illustrating a configuration of applying the oxide semiconductor device in the sixth embodiment of the invention to the active matrix OLED display device.

FIG. 15 is a circuit diagram of a main portion illustrating a configuration of an active matrix substrate in a seventh embodiment. Further, FIG. 16 is a schematic plan view illustrating a planar configuration of the active matrix substrate in the seventh embodiment. In this embodiment, devices each having a TFT as a constitutional element having the structure shown in the first embodiment to the sixth embodiment are arranged in an array over a substrate SU. The TFT can be used as a transistor for switching or driving each of the devices in the arrays, as well as may be used also as a transistor for forming a gate line driving circuit GD that transmits signals to a gate interconnect GL connected with a gate electrode layer GE of the TFT and may be used as a transistor for forming a data line driving circuit DB that transmits signals to a data interconnect DL connected with the source electrode/drain electrode SD of the TFT. In this case, the TFT for each of the devices and the TFT in the gate line driving circuit GD or the data line driving circuit DD can be formed simultaneously.

When the array described, above is applied to the active matrix liquid crystal display device, each of the device elements is in a configuration, for example, as illustrated in FIG. 16. When a scanning signal is supplied to the gate interconnect GL extending in the direction x in the drawing, the TFT turns ON and a video signal from a data interconnect DL extending in the direction y in the drawing is supplied through the turned on TFT to a pixel electrode TC. The gate interconnects GL are arranged in parallel in the direction y in the drawing, and the data interconnects BL are arranged in parallel in the direction x in the drawing, and a pixel electrode TC is disposed in a region surrounded by a pair of adjacent gate interconnects GL and a pair of adjacent data interconnects DL (pixel region). In this case, for example, the data interconnect BL is electrically connected with the source electrode SE and the pixel electrode TC is electrically connected with, the drain electrode DE. Alternatively, the data interconnect DL may also serve as the source electrode SE. Further, the array described above may be applied not only to the liquid crystal display devices but also to organic EL display devices, etc. In this case, the TFT is applied to the transistor constituting the pixel circuit. Further, the array described above may be applied to a memory device in which the TFT may be applied to a selection transistor.

When the active matrix substrate is applied to an active matrix liquid crystal display device, a satisfactory result is obtained.

According to this embodiment, when the oxide semiconductor device is applied to various types of display devices, their performance can be improved.

Eighth Embodiment

Application of the thin film transistor and the protective film explained in the first embodiment to the sixth embodiment is not restricted but can be applied, for example, to RFID (radio frequency identification) tags.

Figure 17:
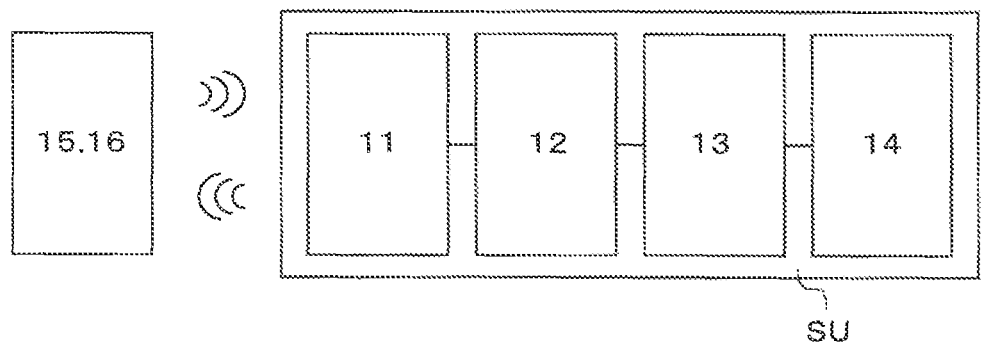
FIG. 17 is a block diagram illustrating a configuration of a RFID (wireless tag) in a seventh embodiment of the invention.

FIG. 17 is a block diagram illustrating configuration, of a circuit system of a RFID tag in an eighth embodiment. The RFID tag includes an antenna resonance circuit 11, a rectifier 12, a modulator 13, a digital circuit 14, etc. The RFID tag is adapted such that wireless communication can be performed between a reader 15 and a writer 16. Further, since the oxide semiconductor includes a transparent material, a substantially transparent circuit can be formed. For example, this can be obtained by using a transparent conductive film such as ITO for electrodes and interconnect portions and using the structure of the invention for the TFT portion. Since structures, for example, Si chips and metal antennas are not visible as in the conventional RFID tags, they can be added optionally without impairing an aesthetic design shown on films or cards.

The RFID tag, particularly, the digital circuit 14 thereof is constructed by using the thin film transistor which is described with reference to the first embodiment to the fourth embodiment. As a result, the digital circuit 14 is reduced in the area and improved in the operation speed, and wireless operation of RFID tag is possible.

What is claimed is:

1. An oxide semiconductor target formed by sintering a Zn—Sn—O oxide semiconductor material comprising zinc oxide and tin oxide as a main ingredient,
   wherein a compositional ratio of Zn that constitutes the Zn—Sn—O oxide semiconductor material: [Zn]/([Zn]+[Sn]) is within a range from 0.5 to 0.85 by at %,
   W (tungsten) is added to the oxide semiconductor material, and
   the addition amount of W is within a compositional ratio of 0.07 to 3.8 at %.

2. The oxide semiconductor target according to claim 1, wherein the addition amount of the W is within a compositional range of 0.07 to 2.0 at %.

3. The oxide semiconductor target according to claim 1, wherein the relative density of the sintered oxide semiconductor material is 95% or more.

4. The oxide semiconductor target according to claim 1,
   wherein at least one metal element of Ta (tantalum) and Hf (hafnium) is also added to the oxide semiconductor material, and when:
   an upper limit of addition amounts is defined as a value, obtained by assuming the maximum addition amount of each of the metal elements added alone to the oxide semiconductor material as 1, normalizing each of the metal elements to be added by the maximum addition amount, and controlling within such a range that the total of the normalized addition amounts of each of the metal elements does not exceed 1; and
   a lower limit of addition amounts is defined as a value, obtained by assuming the minimum addition amount of each of the metal elements added alone to the oxide semiconductor material as 1, normalizing each of the metal elements to be added by the minimum addition amount, and controlling within such a range that the total of the normalized addition amounts of each of the metal elements is 1 or more,
   the addition amounts of the W, Ta, and Hf in total is within a compositional range between the upper limit and the lower limit.

5. The oxide semiconductor target according to claim 4, wherein both Ta and Hf are added to the oxide semiconductor material.

6. The oxide semiconductor target according to claim 4,
   wherein when the at least one metal element includes Ta, the maximum addition amount of Ta is 4.7 at % and the minimum addition amount of Ta is 0.5 at %, and
   wherein when the at least one metal element includes Hf, the maximum addition amount of Hf is 6.4 at % and the minimum addition amount of Hf is 0.32 at %.

7. The oxide semiconductor target according to claim 6, wherein both Ta and Hf are added to the oxide semiconductor material.

8. An oxide semiconductor material having an insulating property and constituting a protective film in a semiconductor device,
   wherein the oxide semiconductor material is a Zn—Sn—O oxide semiconductor material including zinc oxide and tin oxide as a main ingredient,
   a compositional ratio of Zn that constitutes the Zn—Sn—O oxide semiconductor material: [Zn]/([Zn]+[Sn]) is within a range from 0.5 to 0.85 by at %,
   W (tungsten) is added to the oxide semiconductor material, and
   the W is contained by 8 at % or more.

* * * * *